US010629465B2

(12) United States Patent
Handlos et al.

(10) Patent No.: US 10,629,465 B2
(45) Date of Patent: Apr. 21, 2020

(54) METHOD FOR CALIBRATING A COMPONENT MOUNTING APPARATUS

(71) Applicant: BESI Switzerland AG, Steinhausen (CH)

(72) Inventors: Harald Handlos, Kundl (AT); Florian Speer, Langkampen (AT); Juergen Stuerner, Volders (AT)

(73) Assignee: BESI Switzerland AG, Steinhausen (CH)

( * ) Notice: Subject to any disclaimer, the term of this patent is extended or adjusted under 35 U.S.C. 154(b) by 0 days.

(21) Appl. No.: 16/403,533

(22) Filed: May 4, 2019

(65) Prior Publication Data

US 2019/0362998 A1 Nov. 28, 2019

(30) Foreign Application Priority Data

May 28, 2018 (CH) .................................... 00677/18

(51) Int. Cl.
*H01L 21/00* (2006.01)
*H01L 21/68* (2006.01)
(Continued)

(52) U.S. Cl.
CPC ...... *H01L 21/681* (2013.01); *H01L 21/67259* (2013.01); *H01L 22/22* (2013.01); *H01L 22/32* (2013.01); *H01L 23/544* (2013.01); *H01L 24/03* (2013.01); *H01L 24/06* (2013.01); *H01L 24/74* (2013.01); *H01L 2223/54426* (2013.01); *H01L 2224/8013* (2013.01)

(58) Field of Classification Search
CPC . H01L 21/681; H01L 21/67259; H01L 22/22; H01L 22/32; H01L 23/544; H01L 24/03; H01L 24/06; H01L 24/74; H01L 2223/54426; H01L 2224/8013
See application file for complete search history.

(56) References Cited

U.S. PATENT DOCUMENTS 5,742,393 A * 4/1998 Landau ................ H01L 21/681 356/620
2011/0281375 A1 11/2011 Swaminathan et al.
(Continued)

FOREIGN PATENT DOCUMENTS

JP H0212840 A 1/1990

*Primary Examiner* — Richard A Booth
(74) *Attorney, Agent, or Firm* — CanaanLaw, P.C.; David B. Ritchie

(57) ABSTRACT

The invention concerns the calibration of a component mounting apparatus configured to mount components on a substrate whose mounting places do not contain local markings. The substrate contains either global substrate markings attached to its edge or other global features that can be used to mount the components. Calibration is carried out by means of a calibration plate which has several calibration positions distributed two-dimensionally over the calibration plate and provided with first optical markings, a test chip which has second optical markings, and a holder attached to the bonding station for temporarily accommodating the calibration plate. The number and arrangement of the calibration positions of the calibration plate and the number and arrangement of the mounting places of the substrate are—apart from possible exceptions—different from one another.

8 Claims, 6 Drawing Sheets

Figure 1:
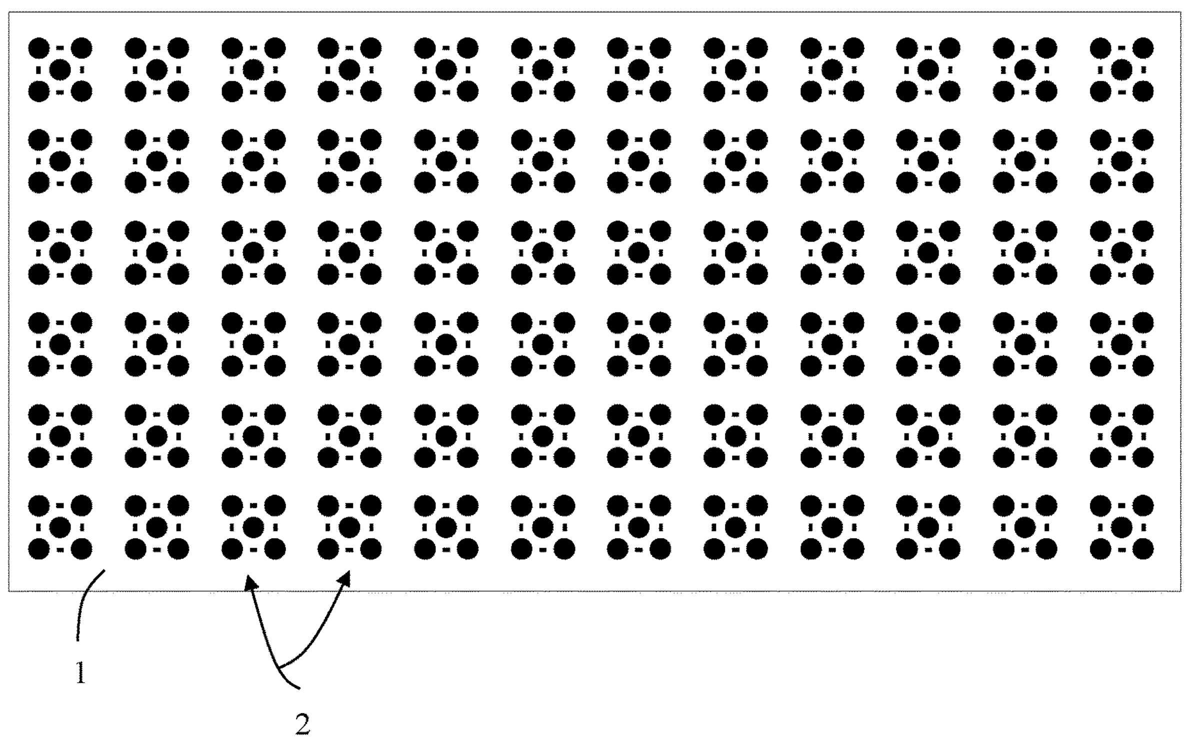

7
4
8
5
2

(51) Int. Cl.

| | |
|---|---|
| ***H01L 21/67*** | (2006.01) |
| ***H01L 23/00*** | (2006.01) |
| ***H01L 23/544*** | (2006.01) |
| ***H01L 21/66*** | (2006.01) |

(56) References Cited

U.S. PATENT DOCUMENTS

2016/0027675 A1* 1/2016 Ravid ............... H01L 21/67259 118/713
2016/0079199 A1 3/2016 Seok et al.
2017/0210148 A1* 7/2017 Verheijen ............... B41J 11/008
2019/0200496 A1* 6/2019 Pruefer .............. H05K 13/0812

* cited by examiner

METHOD FOR CALIBRATING A COMPONENT MOUNTING APPARATUS

PRIORITY CLAIM

Applicant hereby claims foreign priority under 35 U.S.C § 119 from Swiss Application No. 00677/18 filed May 28, 2018, the disclosure of which is herein incorporated by reference.

FIELD OF THE INVENTION

The invention concerns a method for calibrating a component mounting apparatus, also known as apparatus for mounting components.

Such component mounting apparatuses are known in the semiconductor industry as die bonders or pick and place machines. A "die" is a component. The components are in particular electronic, optical, micromechanical, micro-optical or electro-optical components and the like, or also semiconductor chips or flipchips.

SUMMARY OF THE INVENTION

The object of the invention is to develop a component mounting apparatus with which a large number of components can be precisely positioned on a large-area substrate, which has only on its edge substrate markings or other global features that can be used for positioning. Such large-area substrates are, for example, wafers with a diameter of 12 inches or more. Further substrates are printed circuit boards, ceramic substrates, sheet metal carriers, panels and the like. Such panels for example have dimensions of 0.6 m×0.7 m, or more.

The above mentioned task is solved according to the invention by a method with the features of claim 1, with which a mechanically highly stable component mounting apparatus can be calibrated.

The invention therefore concerns a method for calibrating an apparatus for mounting components which is called here also a component mounting apparatus. The component mounting apparatus comprises a bonding station and at least one bond head for placing components on the mounting places of a substrate, a first camera and a second camera. The first camera is used for taking an image of the component or test chip picked up by the bond head and to determine the deviation of the actual position of the component or test chip, respectively, from its target position. The second camera is used on the one hand during the mounting operation to determine global substrate position data, which characterize the position and orientation of the substrate, and on the other hand during the calibration to determine the deviation of the actual position of the test chip mounted on a calibration plate from its target position.

The component mounting apparatus further comprises a transport device that transports one substrate after the other to the bonding station where it is assembled with components. The bonding station includes a pick and place system that moves the bond head(s) to the substrate assembly stations. In order to achieve high placement accuracy, the component mounting apparatus is advantageously configured to transport the substrate to the bonding station and then hold the substrate in place throughout the mounting process. In this case, the working area of the bond head or bond heads is as large as or larger than a substrate.

Since the individual mounting places of the substrates do not contain markings that define their position, the position of each mounting place that the bond head has to approach to mount a component is calculated from global substrate position data that characterize the position and orientation of the substrate. The global substrate position data are either determined from substrate markings provided on the periphery of the substrate or, if the substrate has no substrate markings, from specific global features of the substrate such as "flat" and/or "notch" on a wafer, etc., once the substrate has been transported to the bonding station and fixed there.

To ensure that the position approached by the bond head matches the position calculated for the mounting place, the component mounting apparatus is calibrated. During the calibration, calibration data are determined. The calibration is carried out by means of a holder, a calibration plate, which has a large number of calibration positions, and with one or more test chips. The calibration positions of the calibration plate are distributed two-dimensionally over the calibration plate; they are arranged, for example, in rows and columns. The calibration positions of the calibration plate and the test chip(s) contain mutually matching first and second optical markings, respectively.

The holder for holding the calibration plate is either permanently or detachably mounted in the bonding station of the component mounting apparatus. The component mounting apparatus and the holder are configured so that the calibration data completely cover the working area of the bond head or bond heads. Either a single calibration plate can be used to cover the entire working area, or the holder can be designed to accommodate the calibration plate successively in different positions to cover the entire working area. The working area, and thus the area covered by the calibration data, is advantageously as large as or larger than an entire substrate, so that the substrate can remain fixed at the same position throughout the entire mounting process.

During the calibration a single test chip or several test chips are placed at a number of selected calibration positions and the deviation of the actual position of each placed test chip from its target position is determined using the two cameras and image processing hardware and software that are also provided. The deviation is preferably determined immediately after placement of the respective test chip. The deviation can be represented by a difference vector v with at least two components, for example with two components $v=(x, y)$ or with three components $v=(x, y, \theta)$, wherein the component x denotes a displacement in a first direction, the component y denotes a displacement in a second direction and the component $\theta$ is an angle that denotes a rotation about a center. A difference vector v with two components is often sufficient, namely then when the angular deviation $\theta$ is so small that no disturbing position error results.

The number of selected calibration positions can be increased adaptively during the method, for example if the detected difference vectors indicate a non-linear behavior of the movement axes of the bond head or the bond heads, respectively.

The holder is preferably configured to hold the calibration plate by vacuum and the holder and the calibration plate are preferably configured to hold the test chip by vacuum. The holder and the calibration plate may also be designed to hold the calibration plate magnetically. The holder and/or the calibration plate and the test chip may also be designed to magnetically fix the test chip.

In another embodiment the holder consists only of position pins, which are preferably permanently attached to the bonding station. In this case it is not necessary to insert the holder for calibration and later remove it again. Such a holder cannot hold the calibration plate but only position it.

The calibration plate is preferably a glass plate and the test chip is preferably a glass chip. The first and second optical markings are preferably structures made of chromium, as such structures can be produced with extremely high accuracy. These structures are optically non-transparent.

The determination of the calibration data includes for example the following steps:

A) positioning the calibration plate in the holder of the bonding station and/or fixing the calibration plate to the holder of the bonding station;

B) executing the following steps C to I for a number of calibration positions provided on the calibration plate:

C) with the bond head picking up a test chip,

D) with the first camera taking an image of the test chip held by the bond head and determining the deviation of the actual position of the test chip from its target position, E) calculating the position to be approached by the bond head for the placement of the test chip at the calibration position, F) moving the bond head to the calculated position and placing the test chip on the calibration plate, G) with the second camera taking an image of the test chip placed on the calibration plate, H) determining a difference vector v, which describes a deviation of the actual position of the test chip from its target position.

The difference vector v is a zero vector if no deviation was detected. The test chip or the test chips are each removed at a suitable time after step G. Of course, the same test chip could always be used. The calibration can be refined by repeating all or some steps selected from the steps C to H once or several times in order to get additional difference vectors.

After all or some of the steps C to H have been performed once or several times, one or more difference vectors exist for each calibration position. Therefore, the following step is still to be taken:

I) assigning correction data based on at least one difference vector v to the calibration position.

The following applies to step I of each calibration position used: If the steps C to H have been performed only once, then the correction data of the calibration position contain the one difference vector v. If some of the steps C to H have additionally been performed one ore more times, then several difference vectors v are available. The correction data may then contain for example all or some difference vectors v selected according to certain criteria, or the correction data may alternatively contain a correction vector calculated from all or a few selected difference vectors v.

If the component mounting apparatus has more than one bond head, the above procedure is performed for the working area of each of the bond heads.

If the dimensions of the calibration plate are too small to cover the entire working area of the bond head or bond heads, the calibration plate is attached to the holder in various positions and the calibration procedure described above is performed for each position. The different positions are designed to cover the entire working area of the bond head(s).

After the calibration has been performed, calibration data exist that includes the calibration positions used and the correction data assigned to these calibration positions. The calibration positions are defined by a vector w with at least two components, for example with two components w=(w1, w2) or with three components w=(w1, w2, φ), where the component w1 denotes the position in a first direction and the component w2 denotes the position in a second direction and the component φ is an angle which denotes the rotation around a center. The calibration data thus include a vector w and correction data for each of the calibration positions used.

The number and arrangement of the calibration positions of the calibration plate 1 and the number and arrangement of the mounting places of the substrate are—apart from possible exceptions—different from each other.

In the case of a component mounting apparatus in which the substrate is transported from the transport device to the bonding station and fixed there—for example by suction with vacuum—, then fitted with the components, and then transported away from the bonding station, the calibration data cover an area as large as or larger than a substrate.

Once the calibration has been done, the mounting of the components on the mounting places of the substrate can be performed with the following steps:

- transporting the substrate to the bonding station and fixing the substrate;
- determining global substrate position data characterizing the position and orientation of the substrate; and
- mounting one component after the other on one mounting place of the substrate after the other through the following steps:
- with the at least one bonding head picking up a component from a feed unit;
- with the first camera taking an image of the component held by the bond head and determining the deviation of the actual position of the component from its target position,
- calculating the actual position of the mounting place based on the global substrate position data;
- calculating a correction vector to be used for the mounting place based on selected calibration data;
- calculating the position to be approached by the bond head; and
- moving the bond head to the calculated position and placing the component on the substrate

BRIEF DESCRIPTION OF THE DRAWING FIGURES

Figure 2:
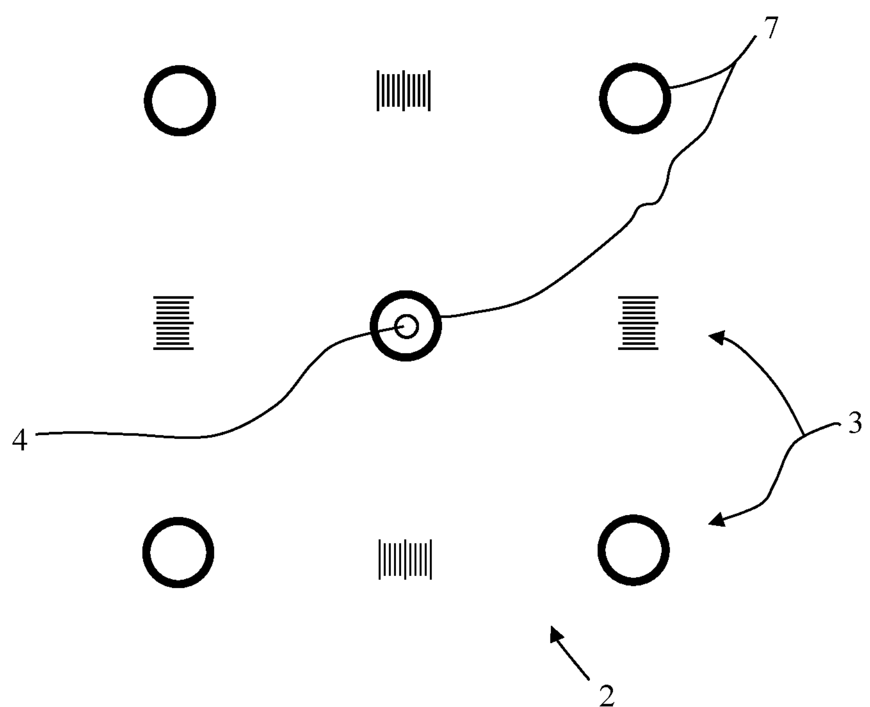
Figure 3:
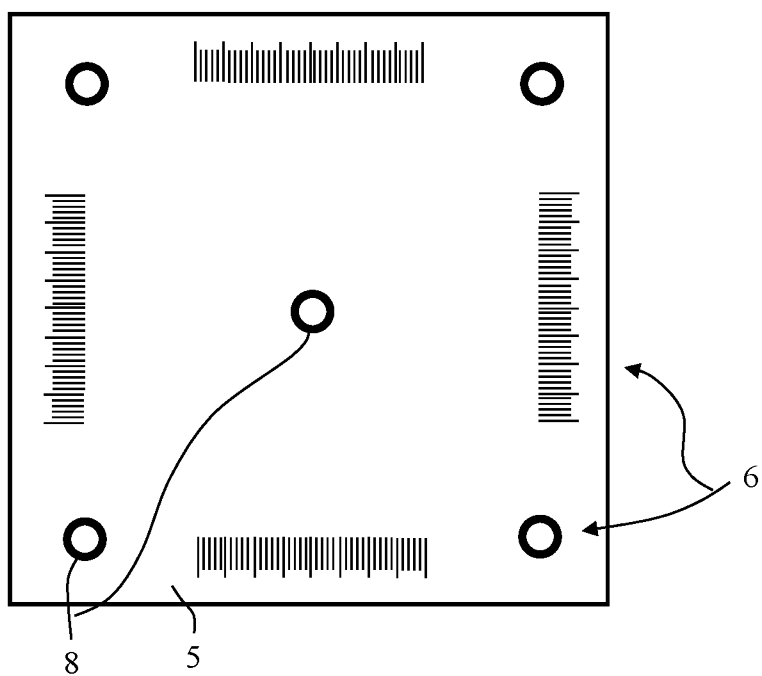
Figure 4:
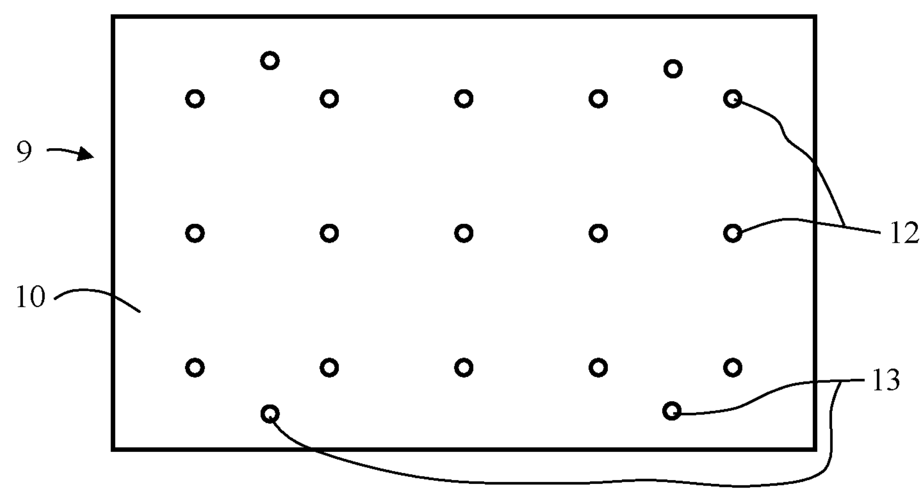
Figure 5:
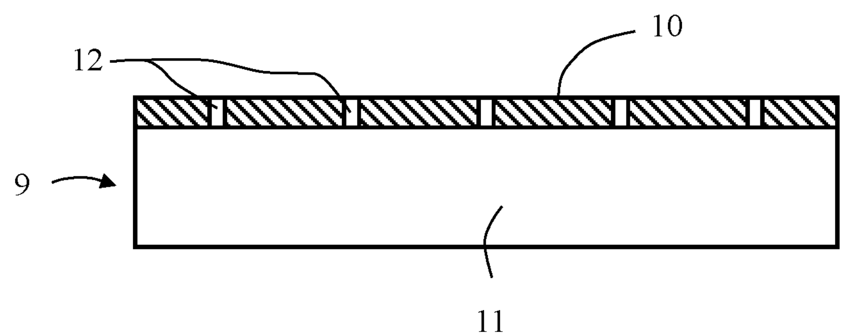
Figure 6:
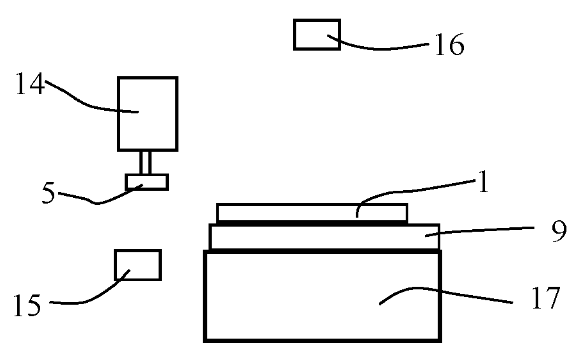
Figure 7:
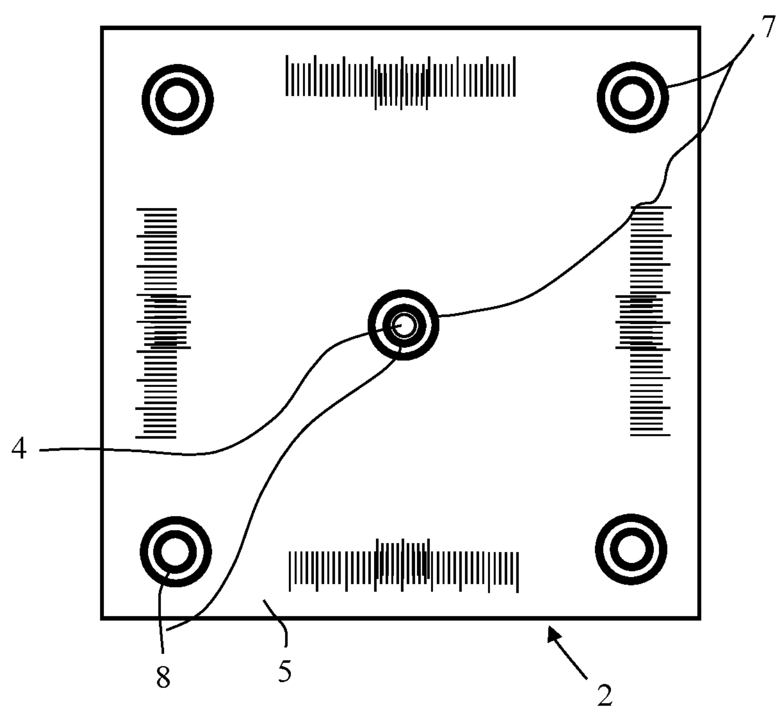

The accompanying drawings, which are incorporated into and constitute a part of this specification, illustrate one or more embodiments of the present invention and, together with the detailed description, serve to explain the principles and implementations of the invention. The figures are drawn schematically and not to scale. In the drawings:

FIG. 1 shows a calibration plate suitable for calibrating the component mounting apparatus, the calibration plate having a plurality of calibration positions, FIG. 2 shows an enlarged view of a calibration position of the calibration plate, FIG. 3 shows a test chip, FIGS. 4 and 5 show a holder for the calibration plate in top view and in cross section, FIG. 6 shows parts of a component mounting apparatus necessary for understanding the invention, and FIG. 7 shows a test chip placed on the calibration plate.

DETAILED DESCRIPTION OF THE INVENTION

A bonding station of a component mounting apparatus is provided with a stationary holder or is configured for the temporary reception of a holder that receives and holds the calibration plate. The calibration plate is a highly stable carrier with extremely precisely defined calibration positions which are arranged two-dimensionally over the entire calibration plate, especially in rows and columns. The calibration plate and the test chips are preferably made of glass, as glass is transparent and has excellent mechanical and optical properties for this application.

The holder is advantageously configured to temporarily hold the calibration plate and the test chip(s) in place. In a preferred embodiment, each calibration position of the calibration plate is provided with a hole that can be supplied with vacuum to fix the test chip(s) with vacuum. The vacuum is supplied by a vacuum source. In an alternative embodiment, the holder and/or the calibration plate and the test chips are provided with magnets and optionally ferromagnetic elements so that magnetic forces cause the test chip(s) to adhere to the calibration plate.

FIG. 1 shows in top view a calibration plate 1 suitable for the calibration of the component mounting apparatus, here a glass plate. The calibration plate 1 shown contains a large number of calibration positions arranged in rows and columns 2. FIG. 2 shows such a calibration position 2 of the calibration plate 1 in enlarged view. Each calibration position 2 contains first optical markings 3. In this embodiment, each calibration position 2 also contains a hole 4 passing through the calibration plate 1 to hold the test chip(s) with vacuum. The hole 4 is preferably located in the center of the respective calibration position 2.

FIG. 3 shows a test chip 5. The test chip 5 is optically transparent and contains various second optical markings 6. The test chip 5 preferably consists of glass.

The first optical markings 3 of the calibration plate 1 and the second optical markings 6 of the test chip 5 are preferably chromium structures and therefore optically non-transparent.

For example, the first optical markings 3 on the calibration plate 1 and the second optical markings 6 on the test chip 5 each contain five rings 7 and 8, respectively, the diameter of the rings 7 on the calibration plate 1 being different from the diameter of the rings 8 on the test chip 5. The mutual distance of the center of the rings is the same for the calibration plate 1 as for the test chip 5, so that if the test chip 5 is placed correctly on the calibration position 2, the rings 7 of the calibration plate 1 run concentrically to the rings 8 of the test chip 5 and are spaced apart from them and can therefore be optically distinguished. The first optical markings 3 and the second optical markings 6 may additionally include scales or nonius scales as shown.

FIGS. 4 and 5 show in top view and in cross section an embodiment of a holder 9, which is designed according to the invention, firstly to hold the calibration plate 1 with vacuum and secondly to apply vacuum to the holes 4 of the calibration plate 1. The holder 9 has a flat surface 10 on which the calibration plate 1 can be placed. The flat surface 10 can have a protruding circumferential edge. The flat surface 10 is provided with first bores 12, which lead into a first chamber 11, which is arranged below the flat surface 10 and can be supplied with vacuum. The first bores 12 are arranged in such a way that they align with the holes 4 of the calibration plate 1, so that the test chips placed on the calibration plate 1 are held with vacuum. The flat surface 10 also contains second bores 13 that lead into a second chamber or groove of the holder 9 that can be supplied with vacuum in order to also fix the calibration plate 1 to the holder 9 with vacuum. The first chamber 11 can also be divided into several individual chambers which can be supplied separately with vacuum. With such a subdivision it is possible to reduce the vacuum consumption if necessary.

In another embodiment, the holder consists only of position pins, which are preferably permanently attached to the bonding station. The insertion of the holder for calibration and removal thereafter is not necessary in this case. Alternatively, the position pins could be temporarily inserted into the bonding station for calibration and removed again after calibration. Such a holder cannot hold the calibration plate, but only position it, and since it only consists of position pins, it also does not have a flat surface. In this example, neither the holder nor the test chips are held with vacuum.

FIG. 6 schematically shows the parts of a component mounting apparatus necessary for understanding the invention. The bonding station 17 of the component mounting apparatus comprises a pick and place system with at least one bond head 14 which places the components on a substrate. Various different substrates are used as substrates. The substrates are transported by a transport device to the bonding station 17 and away from the bonding station 17. The holder 9 according to the invention is arranged in the bonding station 17. The holder 9 is preferentially fastened in a replaceable manner, as it is typically only required for the calibration of the component mounting apparatus. The component mounting apparatus comprises a first camera 15 and a second camera 16, as well as image processing hardware and software. The first camera 15 is used to determine the deviation of the actual position of the component picked up by the bond head 14 from its target position during mounting or the deviation of the actual position of the test chip 5 picked up by the bond head 14 from its target position during calibration. The second camera 16 is used, on the one hand, to determine the global substrate position data, which characterize the position and orientation of the substrate during the mounting operation, and, on the other hand, during calibration to determine the deviation of the actual position of the test chip 5 placed on the calibration plate 1 from its target position. There exist component mounting apparatuses, where the second camera 16 is mounted at a fixed position or movably at the bonding station, and there exist component mounting apparatuses, where the second camera 16 is attached to the bond head 14. The first camera 15 is located below the travel path of the bond head 14 and sees the component or test chip 5 from below. The second camera 16 is located above the holder 9, so that the substrate or calibration plate 1, respectively, is in its field of view. The holder 9 is preferably black so that it only appears as a black background in the images of the second camera 16 and thus does not influence the image processing.

FIG. 6 shows the holder 9, the calibration plate 1 and a test chip 5 which are used during calibration. In regular mounting mode, the substrate is at the position of the calibration plate 1 and a component is at the position of the test chip 5.

The method for the calibration of the component mounting apparatus according to the invention uses the above-mentioned means—calibration plate 1, holder 9 for calibration plate 1, as well as bond head 14, cameras 15, 16 and image processing hardware and software of the component mounting apparatus—and comprises the following steps:

A) positioning the calibration plate 1 in the holder 9 of the bonding station 17 and/or fixing the calibration plate 1 to the holder 9 of the bonding station 17;

B) executing the following steps C to I for a number of calibration positions 2 provided on the calibration plate 1:

C) with the bond head 14 picking up a test chip 5,

D) with the first camera 15 taking an image of the test chip 5 held by the bond head 14 and determining the deviation of the actual position of the test chip 5 from its target position, E) calculating the position to be approached by the bond head 14 for the precise placement of the test chip 5 at the calibration position 2 of the calibration plate 1, F) moving the bond head 14 to the calculated position and placing the test chip 5 on the calibration plate 1, G) with the second camera 16 taking an image of the test chip 5 placed on the calibration plate 1, H) determining a correction vector v, which describes a deviation of the actual position of the test chip 5 from its target position.

After all or some of the steps C to H have been performed once or several times, one or more difference vectors exist for each calibration position. Therefore, the following step is still to be taken:

I) assigning correction data based on at least one difference vector v to the calibration position.

The correction data of each calibration position contain for example all or some difference vectors v selected according to certain criteria, or the correction data may alternatively contain a correction vector calculated from all or a few selected difference vectors v.

The position to be approached by the bond head 14 in step E is calculated based on the actual position of the selected calibration position and on the deviation of the actual position of the test chip 5 from its target position determined in step D. The actual position of the selected calibration position 2 can be determined either from global markings, which are arranged in the edge area of the calibration plate 1, for example, or from local markings, which are arranged in the area of the selected calibration position 2. In the second case, the following step can be performed between steps D and E: with the second camera, 16 taking an image of the selected calibration position 2 and determining the actual position of the selected calibration position 2.

FIG. 7 shows an image taken by camera 15 of a test chip 5 placed at a calibration position 2 of the calibration plate 1. The image shows both the first optical markings 3 of the calibration plate 1 and the second optical markings 6 of the test chip 5. The image processing hardware and software of the component mounting apparatus is configured to determine the actual position of the optical markings 6 of the test chip 5 relative to the actual position of the optical markings 3 of the calibration plate 1 and to determine the deviation of the actual position of the test chip 5 from its target position.

The calibration plate 1 is fixed at the bonding station by inserting the mentioned holder 9 at the intended position and placing the calibration plate 1 on the holder 9 and fixing it with vacuum or magnetically.

The determination of the actual position of the test chip 5 or the calibration position 2, respectively, or the determination of the deviation of the actual position of the test chip 5 from its target position, respectively, from the respective image is carried out by means of the image processing hardware and software of the component mounting apparatus.

Because the test chip 5 is transparent, both the optical markings 6 of the test chip 5 and the optical markings 3 of the underlying calibration position 2 are visible in the image captured by the second camera 16.

If the holder 9 is provided with a single first chamber 11, the holes 12 of all calibration positions 2 will of course be supplied with vacuum at the beginning of the test procedure. If the holder 9 is provided with several chambers, vacuum is applied to one chamber after the other and a test chip 5 is placed on the calibration position assigned to the chamber under vacuum. A single test chip 5 can be used. In this case, the bond head 14 places this test chip 5 successively on each of the selected calibration positions 2 of the calibration plate 1 according to the above mentioned procedure. The number of calibration positions 2 used can include all calibration positions 2 of the calibration plate 1 or only some selected calibration positions 2 of the calibration plate 1. The test chip or test chips 5 can also be placed several times on the selected or all calibration positions 2.

In normal working mode of the component mounting apparatus, components can now be placed on the substrate places of a substrate with high positional accuracy, namely with the following steps A2) transporting the substrate to the bonding station 17 and fixing the substrate at the bonding station 17;

B2) determining global substrate position data;

C2) and mounting one component after the other on one mounting place of the substrate after the other by the steps D2 to H2:

D2) with the bond head 14 or one of the bond heads picking up a component from a feed unit;

E2) with the first camera 15 taking an image of the component held by the bond head 14 and determining the deviation of the actual position of the component from its target position;

F2) calculating the actual position of the mounting place based on the global substrate position data;

G2) calculating the position to be approached by the bond head; and

H2) moving the bond head 14 to the calculated position and placing the component on the substrate.

The global substrate position data characterize the position and orientation of the substrate and thus also the position and orientation of the mounting places. The global substrate position data in step B2 are determined either from substrate markings provided on the edge of the substrate or, if the substrate has no substrate markings, by special global features of the substrate. For example, if the substrate is a wafer, global features such as flat and/or notch of the wafer may be used. To determine the global substrate position data, the second camera 16 takes one or more images of the substrate markings or special features of the substrate and the image processing hardware and software determines the position of the substrate with respect to the machine coordinates of the bond head 14 or bond heads 14.

The calculation of the actual position (which also includes its orientation) of the mounting place in step F2 is based on the global substrate position data.

The calculation of the position to be approached by the bond head in step G2 is based on the deviation of the actual position of the component picked up by the bond head from its target position determined in step E2, the actual position of the mounting place calculated in step F2, and a correction vector determined on the basis of selected calibration data. The number and arrangement of the calibration positions of the calibration plate 1 and the number and arrangement of the assembly stations of the substrate are—apart from possible exceptions—different from each other. The calculation of the correction vector to be used for the mounting place is therefore performed with advantage by means of an interpolation method which calculates the correction vector to be used on the basis of selected calibration data, the selected calibration data comprising one or more calibration positions surrounding the current mounting place and the correction data assigned to the one or more calibration positions.

In a component mounting apparatus in which the substrate is transported by the transport device to the bonding station 17 and fixed there, then assembled with the components and transported away from the bonding station 17, the calibration data cover an area as large as or larger than a substrate.

The method in accordance with the invention can also be used to test the position accuracy or validity of the calibration of the component mounting apparatus under long-term effects such as for example temperature changes, humidity changes, etc., since the placement of the test chip(s) 5 on the calibration positions 2 can be carried out during long periods, for example during a whole night, without the need for manual work such as for example the cleaning of the calibration plate 1.

The method according to the invention can be used for the assembly of substrates of any size, although it has been developed for large-area substrates. The method can also be used if the substrates contain local markings.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A method for calibrating a component mounting apparatus, the component mounting apparatus comprising a bonding station and at least one bond head for placing components on mounting places of a substrate, a first camera and a second camera, wherein the mounting of the components on the mounting places of the substrate comprises the following steps:

transporting the substrate to the bonding station and fixing the substrate;

determining global substrate position data characterizing the position and orientation of the substrate; and mounting one component after the other on one mounting place of the substrate after the other with the following steps:

with the at least one bonding head picking up a component from a feed unit;

with the first camera taking an image of the component held by the bond head and determining the deviation of the actual position of the component from its target position, calculating the actual position of the mounting place based on the global substrate position data;

calculating a correction vector to be used for the mounting place based on selected calibration data;

calculating the position to be approached by the bond head; and moving the bond head to the calculated position and placing the component on the substrate;

and wherein the calibration includes determining calibration data with the following steps:

positioning a calibration plate in a holder of the bonding station and/or fixing a calibration plate to a holder of the bonding station, the calibration plate having a plurality of calibration positions distributed two-dimensionally over the calibration plate and provided with first optical markings;

executing the following steps for a number of calibration positions:

with the bond head picking up a test chip provided with second optical markings, with the first camera taking an image of the test chip held by the bond head and determining a deviation of the actual position of the test chip from its target position, calculating the position to be approached by the bond head for the placement of the test chip on the calibration position, moving the bond head to the calculated position and placing the test chip on the calibration plate, with the second camera taking an image of the test chip placed on the calibration plate, determining a difference vector which describes a deviation of the actual position of the test chip from its target position;

assigning correction data based on at least one difference vector to the calibration position, wherein the calibration data comprise the calibration positions used and the correction data assigned thereto.

2. The method according to claim 1, wherein the individual mounting places of the substrate do not contain any markings.

3. The method according to claim 1, wherein the number and arrangement of the calibration positions used in the calibration and the number and arrangement of the mounting places of the substrate are different from each other, and wherein the calculation of the correction vector to be used for the mounting place is carried out by means of an interpolation method which calculates the correction vector to be used on the basis of selected calibration data comprising one or more calibration positions surrounding the current mounting place and the correction data associated with the one or more calibration positions, respectively.

4. The method according to claim 2, wherein the number and arrangement of the calibration positions used in the calibration and the number and arrangement of the mounting places of the substrate are different from each other, and wherein the calculation of the correction vector to be used for the mounting place is carried out by means of an interpolation method which calculates the correction vector to be used on the basis of selected calibration data comprising one or more calibration positions surrounding the current mounting place and the correction data associated with the one or more calibration positions, respectively.

5. The method according to claim 1, wherein the substrate remains fixed during the mounting of the components and the calibration data cover an area as large as or larger than a substrate.

6. The method according to claim 2, wherein the substrate remains fixed during the mounting of the components and the calibration data cover an area as large as or larger than a substrate.

7. The method according to claim 3, wherein the substrate remains fixed during the mounting of the components and the calibration data cover an area as large as or larger than a substrate.

8. The method according to claim 4, wherein the substrate remains fixed during the mounting of the components and the calibration data cover an area as large as or larger than a substrate.

* * * * *